United States Patent
Hsiao et al.

(10) Patent No.: US 9,570,451 B1
(45) Date of Patent: Feb. 14, 2017

(54) METHOD TO FORM SEMICONDUCTOR DEVICES

(71) Applicant: UNITED MICROELECTRONICS CORP., Hsin-Chu (TW)

(72) Inventors: Shih-Yin Hsiao, Chiayi County (TW);
Ching-Chung Yang, Hsinchu (TW);
Tun-Jen Cheng, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/151,483

(22) Filed: May 10, 2016

(51) Int. Cl.
| | |
|---|---|
| H01L 21/338 | (2006.01) |
| H01L 27/11 | (2006.01) |
| H01L 21/266 | (2006.01) |
| H01L 21/027 | (2006.01) |
| H01L 21/265 | (2006.01) |

(52) U.S. Cl.
CPC ....... *H01L 27/1116* (2013.01); *H01L 21/0273* (2013.01); *H01L 21/266* (2013.01); *H01L 21/26513* (2013.01); *H01L 21/26586* (2013.01); *H01L 27/1104* (2013.01)

(58) Field of Classification Search
CPC ............. H01L 21/26586; H01L 21/266; H01L 21/823412; H01L 27/11; H01L 29/66492; H01L 29/6659; H01L 29/7833
See application file for complete search history.

(56) References Cited

U.S. PATENT DOCUMENTS

| | | | | |
|---|---|---|---|---|
| 5,827,763 | A * | 10/1998 | Gardner | .......... H01L 21/823412 257/E21.346 |
| 7,132,340 | B2 * | 11/2006 | Sadra | ................ H01L 21/26586 257/E21.255 |
| 8,361,866 | B2 | 1/2013 | Lee | |
| 2007/0287239 | A1 * | 12/2007 | Yoon | ....................... H01L 27/11 438/184 |

* cited by examiner

*Primary Examiner* — Jaehwan Oh
(74) *Attorney, Agent, or Firm* — Winston Hsu; Scott Margo

(57) ABSTRACT

A method of forming semiconductor devices. First, a substrate is provided, and a first implant area and a second implant area are defined in a mask pattern. Subsequently, a resist layer on the substrate is patterned using the mask pattern to form a first opening exposing the first implant area and a second opening to expose the second implant area. After that, an ion implantation process including a partial shadowing ion implant is processed, wherein the second implant area is implanted by the partial shadowing ion implant to a predetermined concentration, and the first implant area is substantially not implanted by the partial shadowing ion implant.

20 Claims, 9 Drawing Sheets

(a)

(b)

METHOD TO FORM SEMICONDUCTOR DEVICES

BACKGROUND OF THE INVENTION

1. Field of the Invention

The invention generally related to a method to manufacture semiconductors devices. More particularly, the invention related to a method to form semiconductor devices with reduced process steps.

2. Description of the Prior Art

As the functions of a semiconductor chip become more and more complicated, it usually comprises a variety of devices with different electrical characteristics.

The threshold voltage (Vt) represents the switching characteristic of a transistor, and it is crucial for the magnitude of drive current and off-state leakage current. Generally, devices may be classified according to their threshold voltage. For example, devices of the same type, such as MOS transistors having the same geometry but different threshold voltages, may be classified into low threshold voltage devices (LVT), regular threshold voltage devices (RVT) and high threshold voltage devices (HVT). It is a sophisticated task during semiconductor manufacturing to adjust the threshold voltage of a device to its target value to obtain expected electrical behavior and better performance.

The threshold voltage of a transistor depends on various properties, such as geometry size of the transistor, or material used to fabricate the transistor. The threshold voltage may also be adjusted by performing implantation, such as forming a Vt adjusting implant layer in the well region, or forming a pocket (halo) implant area in the channel region. Implantation to form the pocket implant area is usually performed at the stage after formation of the gate structure, and is incident from a direction with a particular tilt angle, which is defined as the subtended angle between the incident ion beam and the nominal axis of the wafer. The tilt angled implantation allows dopant in the ion beam to be implanted into the desired pocket implant area which is adjacent to the gate edge and overlapped by the gate structure. In a cross-sectional view taken along the channel direction of a transistor, two pocket implant areas are usually formed symmetrically at the two ends of the channel. Furthermore, to ensure that the tilted pocket implant would produce the same transistor regardless of their locations and orientations on the wafer, a wafer rotation is usually simultaneously carried out during the implant process.

Because the pocket implant is tilted at an angle, a nearby structure or sidewall of a resist layer may shadow part of the exposed area, preventing the dopant from implanting into the shadowed area. This phenomenon is referred to as "pocket shadowing" or "pocket blocking", and usually results in undesirable deviations of the electrical characteristics of the transistor, such as a lower threshold voltage and a raised drive current which are not originally designed for the transistor. Therefore, such shadowing has traditionally been avoided to mitigate these undesirable deviations of the transistors by setting a proper tilt angle of the implant, or setting a minimum distance from the edge of resist layer to where is intended to be implanted.

In advanced semiconductor manufacturing, pocket implant area has been more frequently adopted for adjusting the threshold voltages of devices, for it may allow the scaling of the channel length to boost the drive current without the side effect of an increasing off-state leakage.

Generally, for devices with different threshold voltages, pocket implant areas of each of these devices are individually formed in different steps comprising different photo masks to define which areas are to be implanted, and different ion species or dosages specific for each of the devices.

For example, please refer to FIG. 1, which illustrates the conventional method to form pocket implant areas of, for example, two different devices 10 and 20. As shown in FIG. 1(a), a substrate 1 comprising at least a first device 10 and at least a second device 20 disposed in different areas is provided. There may be an isolation structure 2 between the active area 12 of the first device 10 and the active area 22 of the second device 20. In this case, the first device 10 and the second device 20 may have the same channel orientation, but in other cases, their channel orientations may be perpendicular to each other. As shown in FIG. 2(b), after forming their gate structures 11 and 21, a photolithography process and a following angled ion implantation process 13 are performed to implant the first device 10 which is exposed from an opening 31 of the mask layer 30. The second device 20 is covered by the mask layer 30, and would not be implanted by the angled ion implantation 13.

Subsequently, as shown in FIG. 1(c), after removing the mask layer 30, another photolithography process and another angled ion implantation process 23 is carried out, to implant the second device 20 which is exposed from a second opening 33 of the mask layer 32. This time, the first device 10 is covered by the mask layer 32, and would not be implanted by the angled ion implantation 23. After the ion implantation process 23, the mask layer 32 is removed too.

The angled ion implantation 13 and 23 may comprise different ion species and doping dosages, which are individually selected in accordance with the first device 10 and the second device 20. As a result, as shown in FIG. 1(d), by the two photography-implantation routes as previously described, pocket implant areas 10a and 10b of the first device 10 and pocket implant areas 20a and 20b of the second device 20 are formed respectively. As more and more devices are integrated into the same chip, conventional process aforesaid to form each device's pocket implant areas respectively may become time consuming. The tedious process not only reduces the productivity, but also has a higher risk to have defects, such as photo resistant residue, left on the wafer, resulting in yield loss. Therefore, there is still a need in the field to provide a method to form different devices with better time and cost efficiency.

SUMMARY OF THE INVENTION

This invention provides a method to form different devices by utilizing the shadowing effect of the resist layer, enabling the selective implantation or blocking of ions into certain regions. Traditionally, efforts are made to minimize the shadowing effect of the resist layer during implantation process to obtain better implant uniformity across the substrate. However, the method disclosed in the present invention intentionally enhances the shadowing effect of the resist layer by adjusting the tilt and twist angle of the implant. Comparing to conventional process to form different devices, the method provided by the present invention has fewer process steps and therefore better time and cost efficiency.

According to one embodiment of this invention, first, a substrate is provided, and a first implant area and a second implant area are defined in a mask pattern. Subsequently, a resist layer on the substrate is patterned using the mask pattern to form a first opening exposing the first implant area and a second opening to expose the second implant area.

After that, an ion implantation process including a partial shadowing ion implant is processed, wherein the second implant area is implanted by the partial shadowing ion implant to a predetermined concentration, and the first implant area is substantially not implanted by the partial shadowing ion implant.

According to another embodiment of this invention, first, a substrate is provided, and a first implant area, a second implant area and a third implant area are defined in a mask pattern. Subsequently, a resist layer on the substrate is patterned using the mask pattern to form a first opening exposing the first implant area and a second opening to expose the second implant area and the third implant area. After that, an ion implantation process including a partial shadowing ion implant is processed, wherein the first implant area is implanted by the partial shadowing ion implant to a predetermined concentration, and the second implant area and the third implant area are implanted by the partial shadowing ion implant to a concentration which is half of the predetermined concentration.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
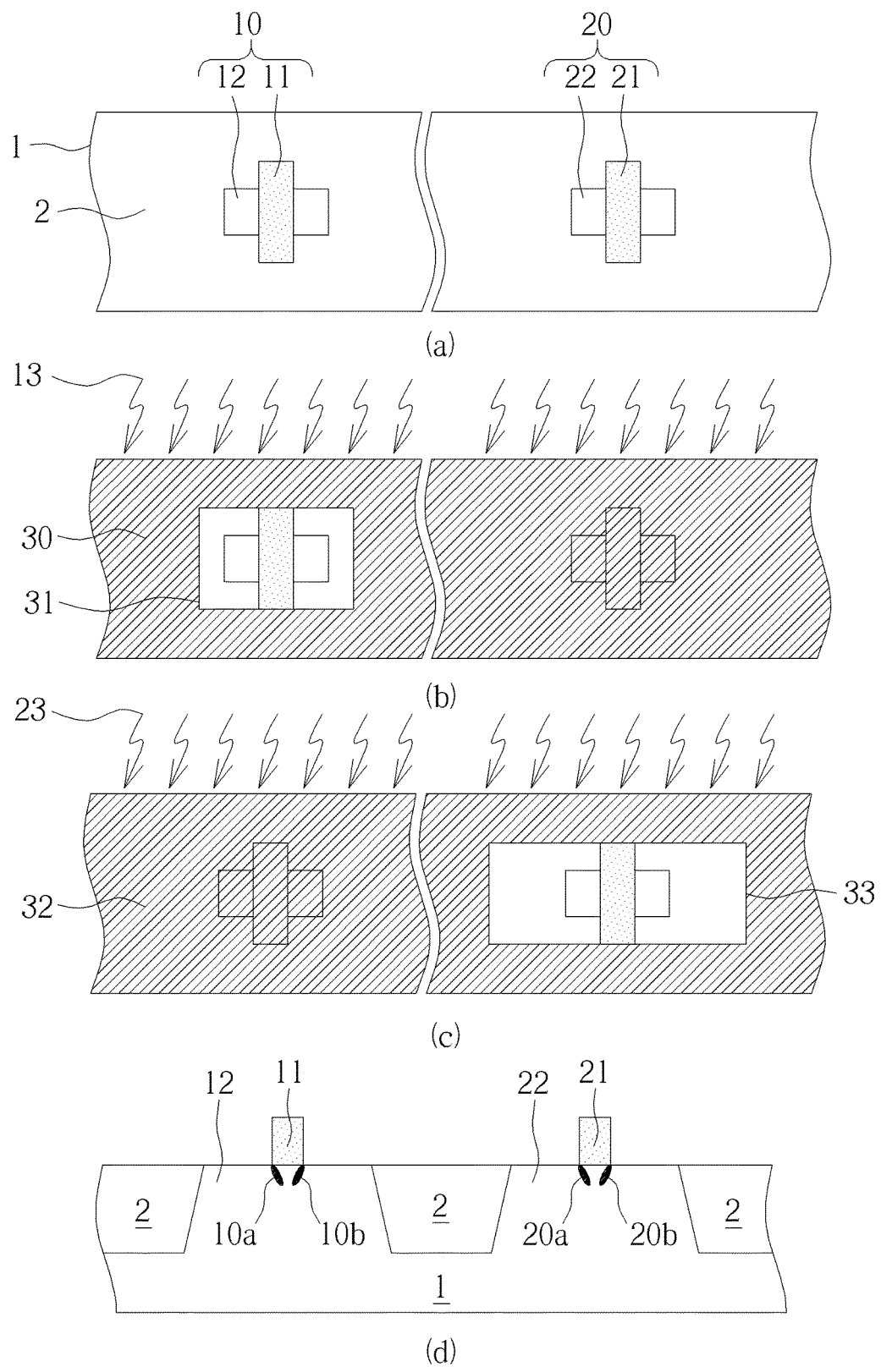
FIG. 1(a), FIG. 1(b), FIG. 1(c) and FIG. 1(d) are schematic diagrams illustrating the conventional method to form different semiconductor devices.

In the following detailed description, reference is made to the accompanying drawings which form a part hereof, and in which is shown, by way of illustration of specific embodiments in which the invention may be practiced. These embodiments are described in sufficient detail to enable those skilled in the art to practice the invention. Other embodiments may be utilized and that structural, logical and electrical changes may be made without departing from the spirit and scope of the present invention. The following detailed description is, therefore, not to be taken in a limiting sense, and the scope of the present invention is defined by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

Spatially relative terms, such as "parallel", "orthogonal", "right", "left", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 2:
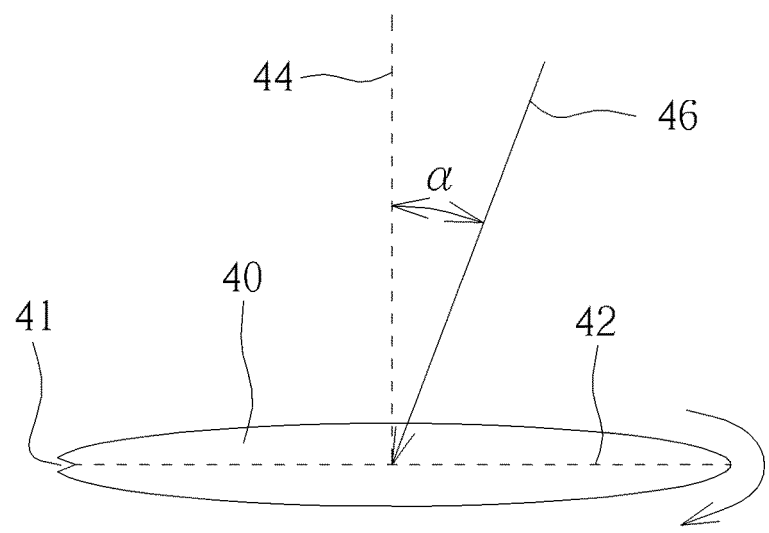
FIG. 2(a) and FIG. 2(b) are schematic diagrams illustrating some parameters used to define the implant direction during an implantation process.
Figure 2:
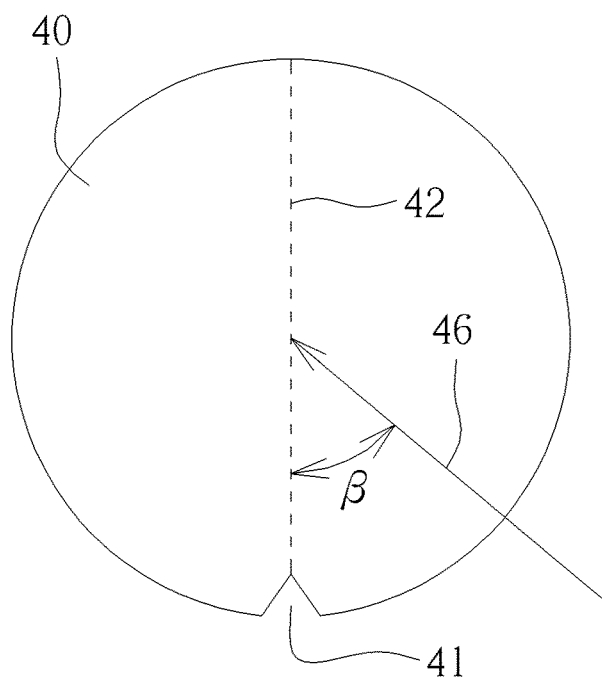

FIG. 2(a) and FIG. 2(b) are schematic diagrams illustrating some parameters used to define the implant direction during an implantation process.

As shown in FIG. 2(a), which is a perspective view of the semiconductor wafer 40 approximating a side view, a wafer notch 41 or a flat (primary flat) may be marked on the wafer edge to define the crystallographic orientation of the semiconductor wafer 40. The incident direction of an implant (or ion beam) 46 is described by a tilt angle $\alpha$ which is the subtended angle between the implant 46 and a wafer normal axis 44 vertical to the surface of the semiconductor wafer 40. A non-zero tilt angle, such as 3° to 7°, of the implant 46 may be adopted to avoid channeling effect. In some cases, a relatively large tilt angle (high angled) is adopted to inject dopants into a particular area. For example, the implant used to form the pocket implant areas of a transistor usually has a relatively large title angle, such as 30°, to implant into a region underneath the undercut of a gate structure.

Additionally, a twist angle $\beta$ is also necessary to describe the incident direction of the implant 46. As shown in FIG. 2(b), which is a top view of the semiconductor wafer 40, the twist angle $\beta$ of the implant 46 is the angle between the plane containing the normal axis 44 and the implant 46 and the plan containing the normal axis 44 and a wafer radius 42 which intersects with the wafer notch 41. Twist angle $\beta$ is a quantitative description to clearly define the crystallographic orientation of the implant 46 with respect to the crystallography orientation of the wafer 40. It should be understood that, generally, the channel orientation of a transistor fabricated on the semiconductor wafer 40 is either parallel or perpendicular to the radius 42. In most cases, tilt angled implants are usually performed at a twist angle either orthogonal or parallel to the channel orientation of devices.

FIG. 3(a), FIG. 3(b), FIG. 3(c), FIG. 3(d), FIG. 3(e), FIG. 3(f), FIG. 4, FIG. 5, FIG. 6 and FIG. 7 are schematic diagrams illustrating the method to form different semiconductor devices according to one embodiment of the present invention.

Figure 3:
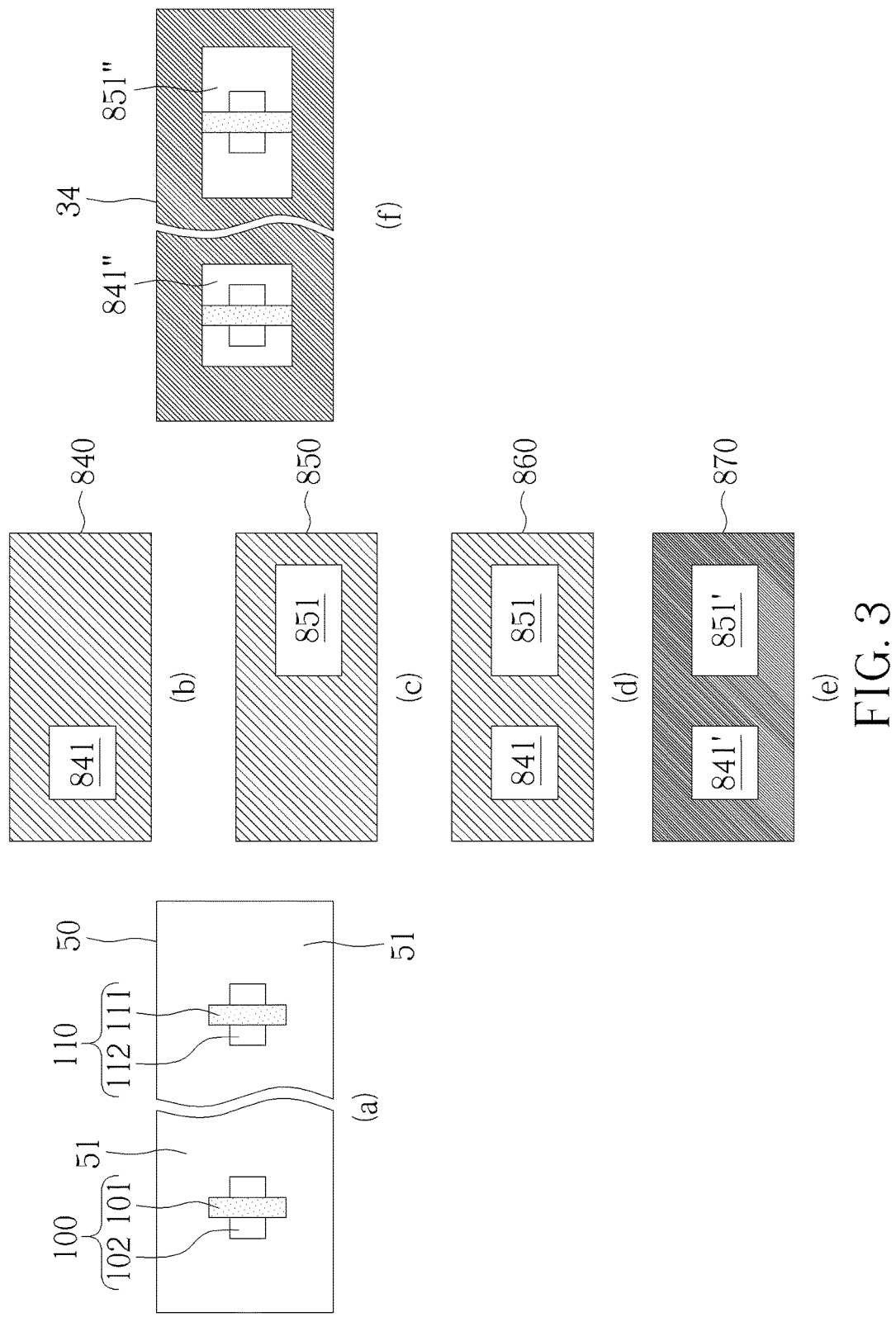
FIG. 3(a), FIG. 3(b), FIG. 3(c), FIG. 3(d), FIG. 3(e), FIG. 3(f), FIG. 4, FIG. 5, FIG. 6 and FIG. 7 are schematic diagrams illustrating the method to form different semiconductor devices according to one embodiment of the present invention.

Please refer to FIG. 3(a). A substrate 50 comprising at least a first device 100 and at least a second device 110 is provided. The substrate 50 may be a semiconductor wafer and having a wafer notch indicating its crystallographic orientation, and a radius intersecting the wafer notch usually serves as a 0° twist reference line. The first device 100 and the second device 110 may be disposed in different areas on the substrate 50, and separated by an isolation structure 51. It should be understood that in other cases, the first device 100 and the second device 110 may be separated by well and junctions. The first device 100 may comprise an active area 102 and a gate structure 101 orthogonally traversing the active area 102. The second device 110 may comprise an active area 112 and a gate structure 111 orthogonally traversing the active area 112. According to the embodiment, the extending directions of the gate structures 101 and 111 may be parallel or orthogonal to each other, and both of them are twisted either parallel or orthogonal relative to the 0° twist reference line. As known in the art, the overlapping area of the active area and the gate structure is the channel region. The active area which is not covered by gate structure is the S/D region.

The first device 100 and the second device 110 may be geometrically similar but electrically different. According to the embodiment, the first device 100 and the second device 110 are both NMOS with approximately the same channel length, but have different threshold voltages. For example, the first device 100 may be a RVT device which has a threshold voltage around 230 mV, and the second device 110 may be a HVT device which has a threshold voltage around 340 mV. It should be noticed that in other embodiments, the first device 100 and the second device 110 may be geometrically different, such as having different channel width and channel length. According to other embodiments, the first device 100 and the second device 110 may be PMOS too.

Please refer to FIG. 3(b) and FIG. 3(c). A first mask pattern 840 with a defined first implant area 841 for the first device 100 and a second mask pattern 850 with a defined second implant area 851 for the second device 110 are provided. It should be understood that each of the first mask pattern 840 and the second mask pattern 850 may be a layer of layout pattern, such as LDD implant layer, belonging to a layout database comprising the first device 100 and the second device 110. Each of the first mask pattern 840 and the second mask pattern 850 may be transferred into real photo masks used in semiconductor manufacturing process by conventional mask manufacturing process. When a resist layer on the semiconductor substrate 50 is patterned using a photo mask made from the first mask pattern 840, an opening corresponding to the first implant area 841 would be formed in the resist layer, exposing the first device 110 for the following implantation process, while other devices would be covered by the resist layer and would not be implanted. Similarly, when using a photo mask made from the second mask pattern 851 to pattern the resist layer, only the second device 110 would be exposed from an opening corresponding to the second implant area 851 and be implanted by another implantation process.

Please refer to FIG. 3(d). According to the embodiment, a third mask pattern 860 is generated by merging the features comprised in the first mask pattern 840 and second mask pattern 850. It may be accomplished by performing database handling operations known by those skilled in the art. For example, the third mask pattern 860 may result from "OR" operation (one of the Boolean operators) of the first mask pattern 840 and the second mask pattern 850. In other words, the third mask pattern 860 may be a layout pattern comprising both features of the first implant area 841 and features of the second implant area 851. According to other embodiments, there may be other operations, such as selective sizing, involved in the database handling process.

Subsequently, as shown in FIG. 3(e), the third mask pattern 860 may be transferred into a real photo mask 870 by, for example, a conventional photo mask manufacturing process. According to the embodiment, the photo mask 870 may comprise an area 841' corresponding to the first implant area 841, and an area 851' corresponding to the second implant area 851.

Please refer to FIG. 3(f). A photolithography process may be carried out to pattern a resist layer 34 on the substrate 50 by the photo mask 870. According to the embodiment, a first opening 841" and a second opening 851" are formed in the resist layer 34 to expose the first device 100 and the second device 110 respectively.

FIG. 4 to FIG. 7 are schematic diagrams illustrating that a two stage ion implantation process 200 is performed after patterning the resist layer 34. The two stage ion implantation process 200 comprises an ion implant 210 and an ion implant 220.

Figure 4:
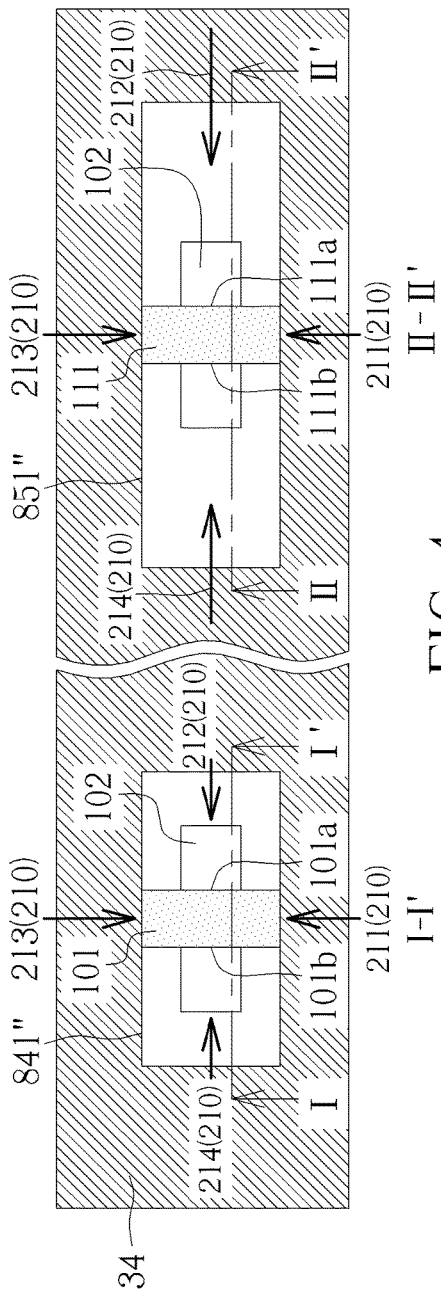

Please refer to FIG. 4. According to the embodiment, the ion implant 210 may be tilted at an angle α1 and twisted at an angle β 1. The ion implant 210 may be performed in quad mode wherein the substrate 50 may be orthogonally rotated (rotating in 90° offset) during the implantation process to ensure that all the exposed at least one first device 100 and at least one second devices 110 would be equally implanted regardless of their orientations and locations on the substrate 50.

As shown in FIG. 4, the ion implant 210 may comprise four sub implants 211, 212, 213 and 214, representing the implants from the four orthogonal directions. In other words, the four sub implants 211, 212, 213 and 214 substantially have the same tilt angle α1, and have twist angles of β1, β1+90°, β1+180°, β1+270° accordingly. According to the embodiment, the tilt angle α1 may range from 30° to 45°, and the twist angle β1 is 0°, which means the twist angles of the four sub implants 211, 212, 213 and 214 are 0°, 90°, 180° and 270° accordingly. According to a preferred embodiment, the tilt angle α1 is approximately 30°. It should be understood that the doping dosage and ion species comprised in each of the four sub implants 211, 212, 213 and 214 are identical.

Figure 5:
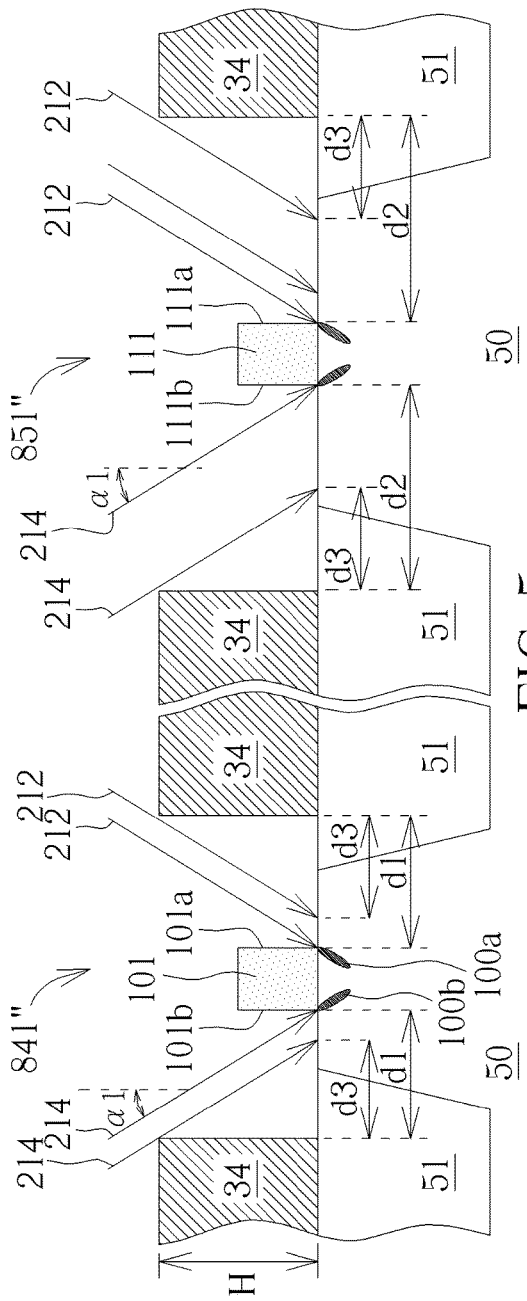

Please refer to FIG. 5. The left part of FIG. 5 is a cross-sectional diagram taken along line I-I' in FIG. 4, and the right part of FIG. 5 is a cross-sectional diagram taken along line II-II'. As shown in the left part of FIG. 5, only the laterally opposed (rotationally opposite or rotationally offset by about 180°) sub implants 212 and 214 which are orthogonal to the gate edge (the edge of the gate structure overlapping the active area) 101a and 101b of the first device 100 would implant into the pocket implant areas 100a and 100b which are to be formed in a region of the active area 102 overlapped by the gate structure 101 and adjacent to the gate edges 101a and 101b. Similarly, as shown in the right part of FIG. 5, only the sub implants 212 and 214 would implant into the pocket implant area 110a and 110b of the second device 110.

According to the embodiment, the distance from the gate edges 101a and 101b to their adjacent resist layer 34 of the sidewall of the first opening 841" are d1. The distance from the gate edges 111a and 11b to their adjacent resist layer 34 of the sidewall of the second opening 851" are d2. The shadowing distance d3 of the sub implant 212 and 214 caused by the resist layer 34 may equal to H*tan(α1), where H is the thickness of the resist layer 34. According to the embodiment, d1 and d2 are both larger than d3, which means the pocket implant areas 100a and 100b of the first device 100, the pocket implant areas 110a and 110b of the second device 110 may be implanted by the sub implants 212 or 214 without being shadowed.

Figure 6:
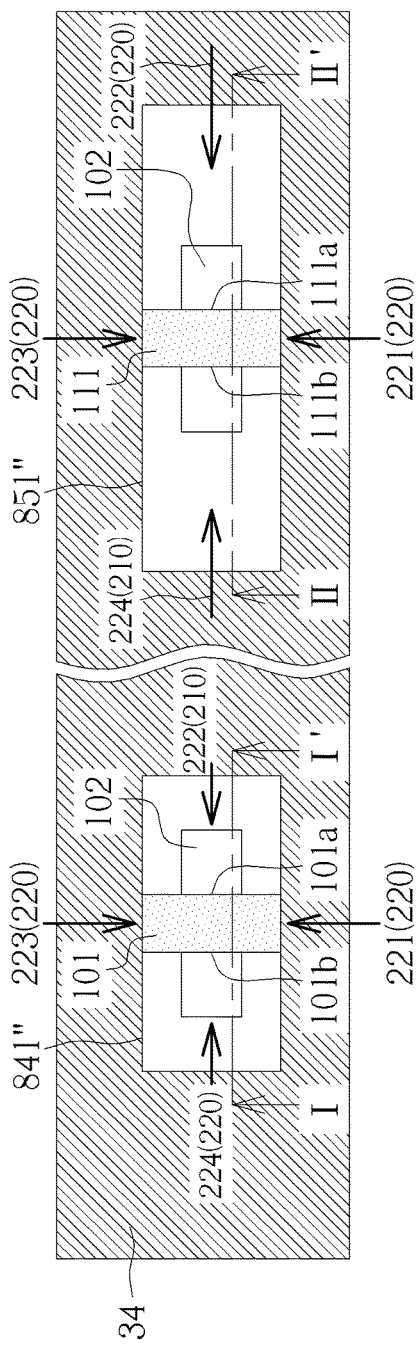

Please refer to FIG. 6. Subsequently, the ion implant 220 may be performed after the ion implant 210 is finished. It should be understood that the sequence of ion implant 210 and ion implant 220 are exchangeable. In other embodiments, the ion implant 220 may be performed before the ion implant 210.

According to the embodiment, the ion implant 220 may be tilted at an angle α2 and twisted at an angle β2. Similarly, the ion implant 210 may be performed in quad mode, comprising four sub implants 221, 222, 223 and 224. The four sub implants 221, 222, 223 and 224 substantially have the same tilt angle α2, and have a twist angle of β2, β2+90°, β2+180°, β2+270° accordingly. According to the embodiment, the tilt angle α2 may range from 30° to 45°, and the twist angle β2 is 0°, which means the twist angles of the four sub implants 221, 222, 223 and 224 are 0°, 90°, 180° and 270°. According to a preferred embodiment, the ion implant 220 is a high angled ion implant, having a tilt angle α2 of approximately 45°. It should be understood that the doping dosage and ion species of each of the four sub implants 221, 222, 223 and 224 are identical.

The ion species, doping dosages and energy of the ion implants 210 and 220 may be selected and adjusted respectively, and may be the same or different according to the needs of the first device 100 or the second device 110. According to the embodiment, the ion implant 210 and 220 comprise the same ion species and doping energy, but comprise different dosages.

Figure 7:
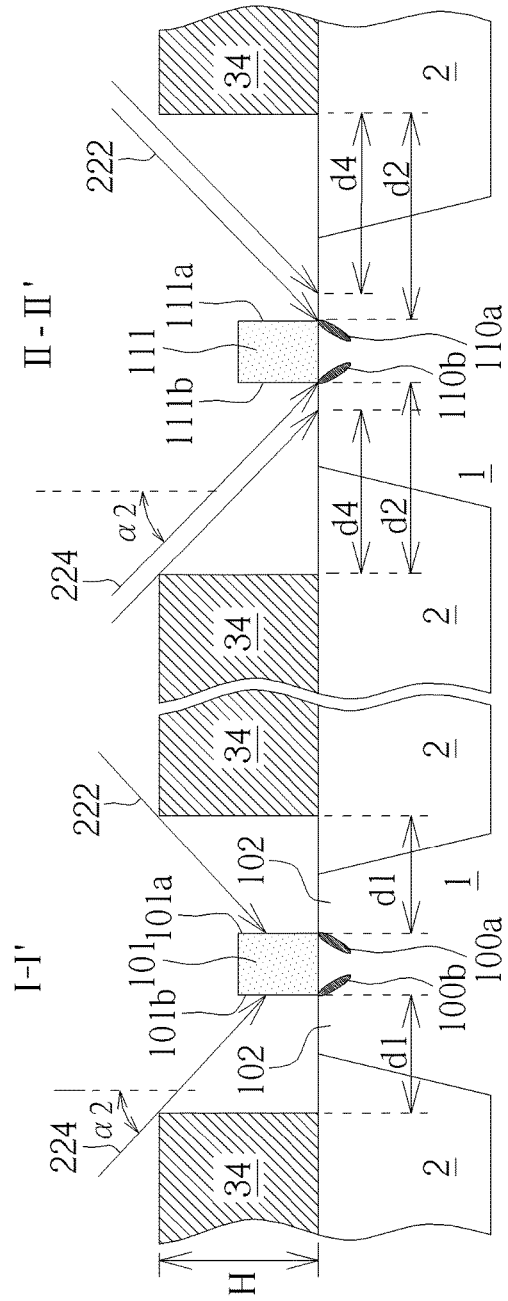

The left part of FIG. 7 is a cross-sectional diagram taken along line I-I' in FIG. 6, and the right part of FIG. 7 is a cross-sectional diagram taken along line II-II'. As shown in the right part of FIG. 7, the shadowing distance d4 of the sub implant 222 and 224 (equal to H*tan(α2)) is smaller than d2, which means the laterally opposed sub implants 222 and 224 which are orthogonal to the gate edge 111a and 111b of the second device 110 would implant into the pocket implant area 110a and 110b of the second device 110. However, as shown in the left part of FIG. 7, the shadowing distance d4 of the sub implant 222 and 224 is larger than d1, which means the pocket implant area 100a and 100b of the first device 100 would be shadowed by the resist layer 34 and not be implanted by the sub implants 222 and 224. In other words, the ion implant 220 is substantially a partial shadowing ion implant, which is able to selectively implant or not implant into individual pocket implant area of the first device 100 and the second device 110 by utilizing the shadowing effect of the resist layer 34.

As a result, by performing the two stage ion implantation process 200 comprising ion implant 210 and the high angled ion implant 220, the pocket implant areas 110a and 110b of the second device 110 are implanted to a pre-determined doping concentration N2 by the sub implants 212 and 222, sub implants 214 and 224 respectively. According to the embodiment where the ion implant 210 and ion implant 220 comprise the same ion species and energy, the pre-determined doping concentration N2 may be the summary of the dosages of sub implants 212 and 222, or of sub implants 214 and 224.

The pocket implant areas 100a and 100b of the first device 100 may have a doping concentration N1. Because the pocket implant areas 100a and 100b of the first device 100 are not implanted by sub implants 222 or 224, the doping concentration N1 is determined by the dosage from sub implant 212 or 214 only, and is smaller than N2. By adjusting the dosages of the ion implants 210 and 220 and the ratio between them, pocket implant areas with the same dopant species but different concentrations, such as N1 for the first device 100 and N2 for the second device 110, may be achieved simultaneously by selective implantation of the partial shadowing ion implant 220.

Please refer to FIG. 8 to FIG. 13, which is another embodiment according to the present invention. The method provided by the present invention may be applied to form different devices belonging to a peripheral area or an array area simultaneously.

Please refer to FIG. 8(a). A substrate 60 comprising at least a first device 150, at least a second device 120 and at least a third device 130 is provided. The substrate may be a semiconductor wafer having a wafer notch indicating its crystallographic orientation, and a radius intersecting the wafer notch usually serves as a 0° twist reference line. According to the embodiment, the first device 150 may belong to a peripheral area, and the second device 120 and the third device 130 may belong to a cell 141 (dashed line) of an array area 140. For example, the cell 141 may be a 6T SRAM cell. The first device 150, the second device 120 and the third device 130 have the same conductivity type. For example, when the first device 150 is a PMOS, the second device 120 and the third device 130 are the two PL devices of the cell 141. When the first device 150 is a NMOS, the second device 120 is one of the PD and PG which sharing an active area of the cell 141, and the third device 130 is one of the PD and PG of which sharing another active area of another SRAM cell which is neighboring to the cell 141. The first device 150 is electrically different from the second device 120 and the third device 130, for example, having different threshold voltages.

The first device 150 may comprise an active area 152 and a gate structure 151 orthogonally traversing the active area 152. The second device 120 may comprise a gate structure 121 orthogonally traversing an active area 122, and the third device 130 may comprise a gate structure 131 orthogonally traversing an active area 132. The active area 122 and the active area 132 are adjacent to each other, extending in the same direction and are isolated by an isolation structure 61. The extending directions of the gate structures 151, 121 and 131 may be twisted either parallel or orthogonal relative to the 0° twist reference line. The gate edges 151a and 151b, 121a and 121b, 131a and 131b are the edges of the gate structures 151, 121 and 131 overlapping the active areas 102, 122 and 132.

Please refer to FIG. 8(b) and FIG. 8(c). A first mask pattern 940 with a defined first implant area 941 for the first device 150 and a second mask pattern 950 with a defined second implant area 951 for the second device 120 and the third device 130 are provided. It should be understood that each of the first mask pattern 940 and the second mask pattern 950 may be a layer of layout pattern, such as LDD implant layer, belonging to a layout database of a chip comprising the first device 150, the second device 120 and the third device 130. Each of the first mask pattern 940 and the second mask pattern 950 may be transferred into real photo masks used in semiconductor manufacturing process by conventional mask manufacturing process.

In a conventional process to form a chip comprising peripheral devices and array devices, pocket implant areas of devices belonging to a peripheral area, such as the first device 150, and devices belonging to an array area, such as the second device 120 and the third device 130, are usually formed respectively by using corresponding masks of their own, and being implanted with specific ion species and dosages corresponding to each of their electrical targets. The conventional process as illustrated hereinabove usually involves multiple photolithography and implantation processes, and is time consuming and not cost efficient. In the following description, a simplified process according to the present invention is provided to form the first device 150, the second device 120 and the third device 130.

Figure 8:
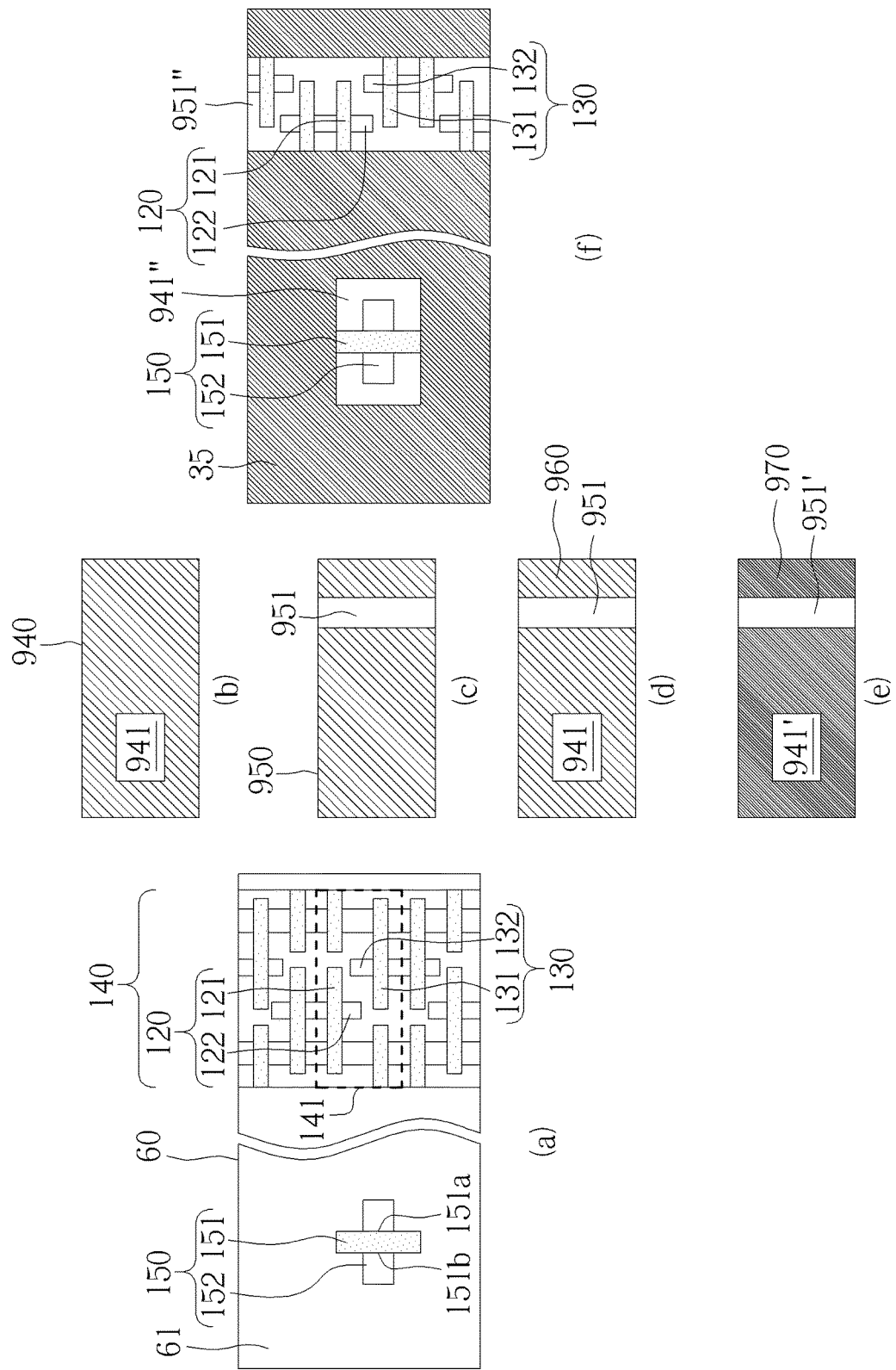
FIG. 8(a), FIG. 8(b), FIG. 8(c), FIG. 8(d), FIG. 8(e), FIG. 8(f), FIG. 9, FIG. 10, FIG. 11, FIG. 12 and FIG. 13 are schematic diagrams, illustrating the method to form different semiconductor devices according to another embodiment of the present invention.

Please refer to FIG. 8 (d). According to the embodiment, a third mask pattern 960 is generated by merging the features comprised in the first mask pattern 940 and in the second mask pattern 950. It may be accomplished by performing database handling operations known by those skilled in the art. For example, the third mask pattern 960 may result from "OR" (one of the Boolean operators) operation of the first mask pattern 940 and the second mask pattern 950. In other words, the third mask pattern 960 may be a layout pattern comprising both features of the first mask pattern 940 and of the second mask pattern 950. According to other embodiments of this invention, there may be other operations, such as selective sizing, involved in the database handling process.

Subsequently, as shown in FIG. 8 (e), the third mask pattern 960 may be transferred into a real photo mask 970 by, for example, a conventional photo mask manufacturing process. According to the embodiment, the photo mask 970 may comprise an area 941' corresponding to the first implant area 941, and an area 951' corresponding to the second implant area 951.

Please refer to FIG. 8 (f). A photolithography process may be carried out to pattern a resist layer 35 on the substrate 60 by using the photo mask 970. According to the embodiment, a first opening 941" and a second opening 951" are formed in the resist layer 35. The first device 150 is exposed from the first opening 941", and the second device 120 and the third device 130 are exposed from the second opening 951". According to the embodiment, the second opening 950" may extend along the extending direction of the active areas 122 and 132 of the second device 120 and the third device 130.

FIG. 9 to FIG. 13 are schematic diagrams illustrating that a two stage ion implantation process 250 is performed after patterning the resist layer 35. The two stage ion implantation process 250 comprises an ion implant 230 and an ion implant 240.

Figure 9:
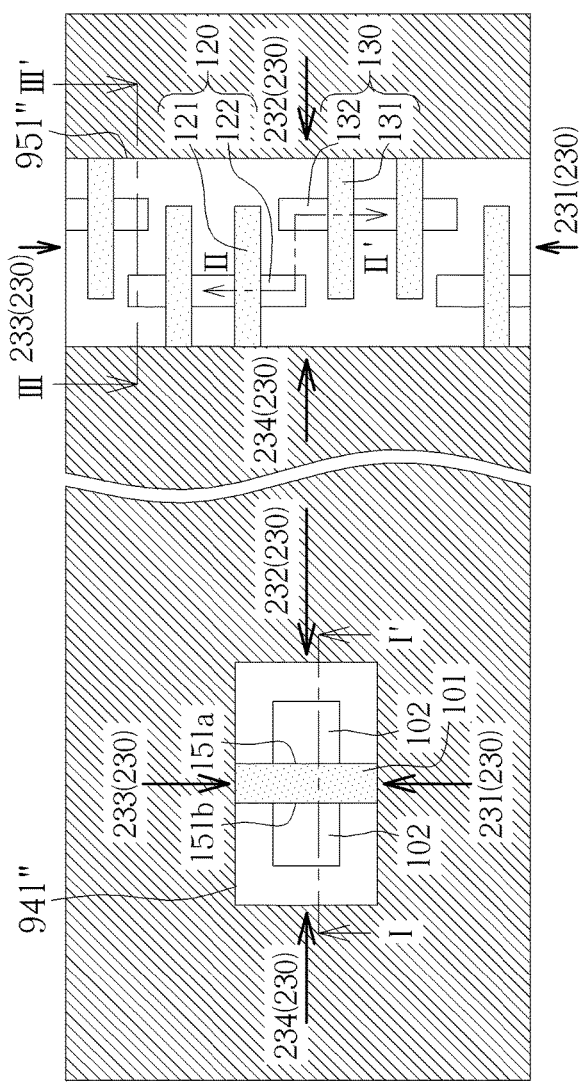

Please refer to FIG. 9. According to the embodiment, the ion implant 230 may be tilted at an angle $\alpha 3$ and twisted at an angle $\beta 3$. The ion implant 230 may be performed in quad mode wherein the substrate 60 may be orthogonally rotated during the implantation process to ensure that all the exposed first devices 150, second devices 120 and third device 130 would be equally implanted regardless of their orientations and locations on the substrate 60.

As shown in FIG. 9, the ion implant 230 may comprise four sub implants 231, 232, 233 and 234 representing the implants from the four orthogonal directions. The four sub implants 231, 232, 233 and 234 substantially have the same tilt angle $\alpha 3$, and have twist angles of $\beta 3$, $\beta 3+90°$, $\beta 3+180°$, $\beta 3+270°$ accordingly. According to the embodiment, the tilt angle $\alpha 3$ may range from 30° to 45°, and the twist angle $\beta 3$ is 0°, which means the twist angles of the four sub implants 231, 232, 233 and 234 are 0°, 90°, 180° and 270° accordingly. According to a preferred embodiment, the twist angle $\alpha 3$ is approximately 30°. It should be understood that the doping dosage and ion species of each of the four sub implants 231, 232, 233 and 234 are identical.

Figure 10:
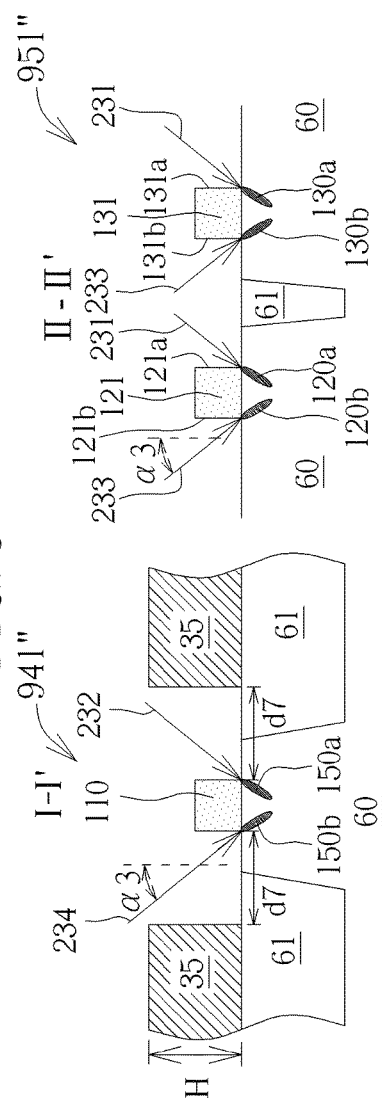

The left part of FIG. 10 is a cross-sectional diagram taken along line I-I' in FIG. 9, and the right part of FIG. 10 is a cross-sectional diagram taken along line II-II'. As shown in the left part of FIG. 10, only the laterally opposed (rotationally opposite or rotationally offset by about 180°) sub implants 232 and 234 which are orthogonal to the gate edge 151a and 151b of the first device 150 would implant into the pocket implant areas 150a and 150b which are to be formed in a region of the active area 152 overlapped by the gate structure 151 and adjacent to the gate edges 151a and 151b. Similarly, as shown in the right part of FIG. 10, only the laterally opposed sub implants 231 and 233 which are orthogonal to the gate edges 121a, 121b and the gate edges 131a, 131b would implant into the pocket implant area 120a and 120b, 130a and 130b of the second device 120 and the third device 130.

According to the embodiment, the shadowing distance (not shown) of the sub implant 232 and 234 caused by the resist layer 35 of the sidewall of the first opening 941" is smaller than the distance d7, which is from the gate edge 151a and 151b to their adjacent sidewall of the resist layer 35. That means the pocket implant areas 150a and 150b would not be shadowed and would be implanted by the sub implants 232 and 234 respectively. According to the embodiment, because the second opening 951" extends along the incident directions of the laterally opposed sub implants 231 and 233, there are no sidewalls to shadow the second device 120 and the third device 130 from being implanted by the sub implants 231 and 233.

Figure 11:
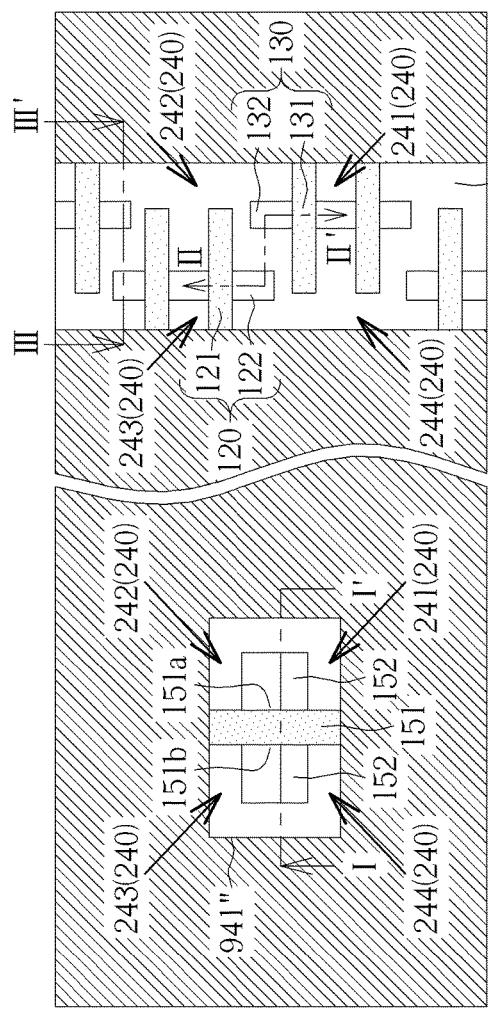

Please refer to FIG. 11. Subsequently, the ion implant 240 may be performed after the ion implant 230 is finished. It should be understood that the sequence of ion implant 230 and ion implant 240 are exchangeable. In other embodiments, the ion implant 240 may be performed before the ion implant 230.

According to the embodiment, the ion implant 240 may be tilted at an angle $\alpha 4$ and twisted at an angle $\beta 4$. Similarly, the ion implant 240 may be performed in quad mode, comprising four sub implants 241, 242, 243 and 244. The four sub implants 241, 242, 243 and 244 substantially have the same tilt angle $\alpha 4$, and have a twist angle of $\beta 4$, $\beta 4+90°$, $\beta 4+180°$, $\beta 4+270°$ accordingly. According to the embodiment, the tilt angle $\alpha 4$ may range from 30° to 45°, and the twist angle $\beta 4$ is 45°, which means the twist angles of the four sub implants 241, 242, 243 and 244 are 45°, 135°, 225° and 315°. According to a preferred embodiment, the ion implant 240 is a high angled ion implant, having a tilt angle $\alpha 4$ of approximately 40°. It should be understood that the doping dosage and ion species of each of the four sub implants 241, 242, 243 and 244 are identical.

The ion species, doping dosages and energy of the ion implants 230 and 240 may be selected and adjusted respectively, and may be the same or different according to devices' needs. According to the embodiment, the ion implant 230 and 240 comprise different ion species and different dosages.

Figure 12:
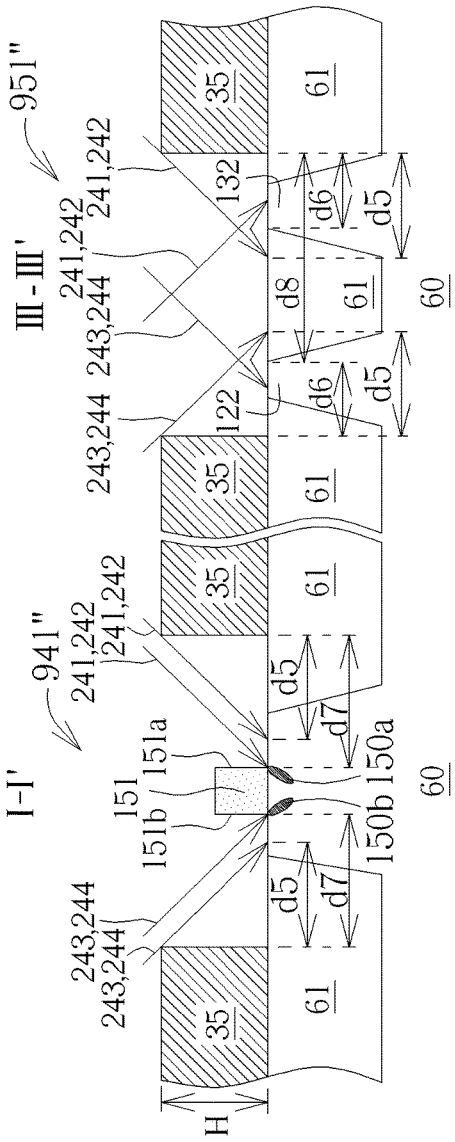

The left part of FIG. 12 is the cross-sectional diagram taken along line I-I' in FIG. 11, and the right side of FIG. 12 is the cross-sectional diagram taken along line III-III'.

Please refer to the left part of FIG. 12. According to the embodiment, because of the 45° twist angle of the ion implant 240, all the four sub implants 241, 242, 243 and 244 are able to implant into the pocket implant areas 150a and 150b without being blocked by the gate structure 151. According to the embodiment, the sub implants 243 and 244 are incident from the left side of the first opening 841", and the sub implants 241 and 242 are incident from the right side of the first opening 841". The shadowing distance d5 of the sub implant 241 and 242 may equal to $H*\tan(\alpha 4)\cos(\beta 4)$, where H is the thickness of the resist layer 35. According to the embodiment, d5 is smaller than d7. Therefore, the sub implant 241 and 242 may be able to implant into the pocket implant area 150a, and the sub implant 243 and 244 may be able to implant into the pocket implant area 150b without being blocked by the resist layer 35 of the sidewall of the first opening 941". According to the embodiment, the pocket implant areas 150a, 150b of the first device 150 are implanted by both sub implant 241 and 242, sub implant 243 and 244 to a doping concentration N3.

Please refer to the right part of FIG. 12. As shown in the diagram, the active area 122 is closer to the left sidewall of the second opening 951", and the third active area 132 is closer to the right sidewall of the second opening 291". The active area 122 and active area 132 are equally distanced from a bisector line (not shown) of the second opening 951". The distance of the active area 122 to the left sidewall of the second opening 951" is d6. According to the embodiment, the shadowing distance d5 of the sub implant 243 and 244 incident from the left side of the opening 291" is larger than d6, which means the active area 122 of the second device 120 would be shadowed by the resist layer 35 at the left side of the second opening 291" from being implanted by the sub implants 243 and 244. The distance from the active area 122 to the right sidewall of the second opening 291" is d8, and d8 is larger than d5. Therefore, the active area 122 of the second device 120 would be implanted by the sub implants 241 and 242 which are incident form the right side of the second opening 951".

Symmetrically, the active area 132 of the third device 130 would be shadowed by the resist layer 35 of the right sidewall of the second opening 951" from being implanted by the sub implants 241 and 242 incident from the right side, and be implanted by the sub implants 243 and 244 incident from the left side.

Figure 13:
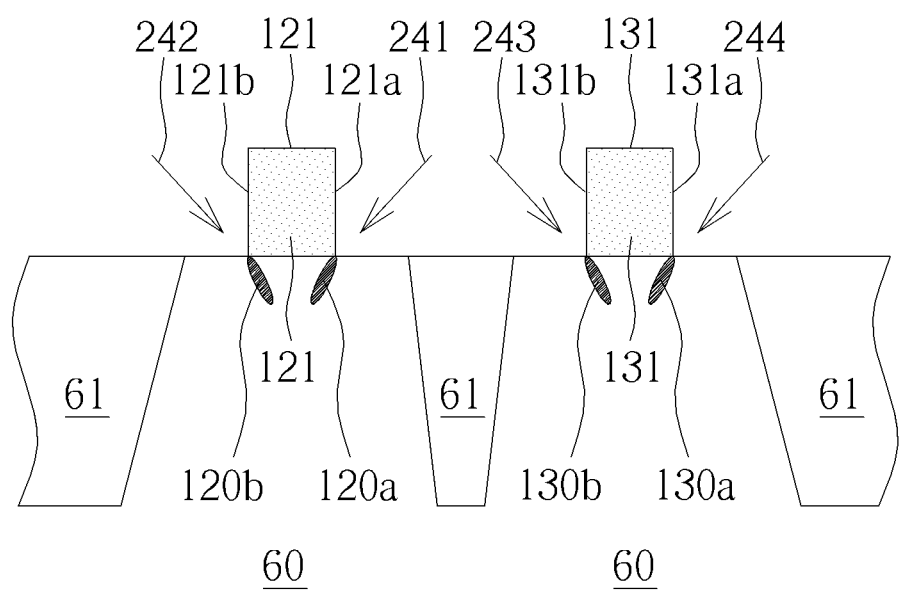

FIG. 13 is the cross-sectional diagram taken along the line II-II' in FIG. 11. As previously illustrated, the active area 122 of the second device 120 may be implanted by the sub implants 241 and 242. It should be understood that the gate structure 121 of the second device 120 may also cause a shadowing area of the active area 122 which is adjacent to one of the gate edges 121a and 121b for an angled ion implant. Therefore, as shown in FIG. 13, the pocket implant area 120a of the second device 120 would be shadowed by the gate structure 121 from the sub implant 242, and be implanted by the sub implant 241. The pocket implant area 120b would shadowed from the sub implant 241 and be implanted by the sub implant 242 which is opposed to the sub implant 241.

Similarly, the pocket implant area 131a of the third device 130 would be implanted by the sub implant 244, and the pocket implant area 131b would be implant by the sub implant 243.

According to the illustrated embodiment, the ion implant 240 is substantially a partial shadowing ion implant, wherein the pocket implant areas of the first device 150, the second device 120 and the third device 130 may be selectively implanted by one or two of the four sub implants 241, 242, 243 and 244 of the ion implant 240 as illustrated in FIG. 12. The selective implantation is achieved by utilizing the shadowing effect of the resist layer 35.

According to the embodiment, the pocket implant areas 150a, 150b of the first device 150 are implanted by sub implant 241, 242 and sub implants 243, 244 respectively. The doping concentration N3 of the ion species comprised in the ion implant 240 of the pocket implant areas 150a and 150b may be a pre-determined value which is the summary of dosages obtained from sub implants 241 and 242 for the pocket implant area 150a, and from sub implants 243 and 244 for the pocket implant area 150b.

Because the pocket implant areas 120a, 120b of the second device 120 and the pocket implant areas 130a, 130b of the third device 130 are implanted by only one of the four sub implants 241,242,243 and 244 as illustrated in FIG. 13, the doping concentration N4 of the ion species comprised in the ion implant 240 is determined by the dosage obtained from a single sub implant of the four sub implants 241, 242, 243 and 244, such as the sub implant 241 for the pocket implant area 120a, the sub implant 242 for pocket implant areas 120b, the sub implant 243 for pocket implant area 130b, and the sub implant 244 for pocket implant area 130a. By the selective implantation of the partial shadowing ion implant 240, the doping concentration N4 is approximately half of the doping concentration N3.

It should be understood that in other embodiments wherein the ion species comprised in the ion implant 230 and ion implant 240 may be identical, the resulting doping concentrations of the ion species in the pocket implant areas may be the summary of the dosages selectively obtained from implanted sub implants of ion implant 230 and 240.

By adjusting the dopant species, dosages and relative ratio of the ion implants 230 and 240, pocket implant areas comprising different doping concentrations for different devices may be formed simultaneously by selective implantation of the partial shadowing ion implant 240.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming semiconductor devices, comprising:
providing a substrate;
defining a first implant area and a second implant area of a mask pattern;
using the mask pattern to pattern a resist layer on the substrate to form a first opening exposing the first implant area and a second opening exposing the second implant area; and
processing an ion implantation process including a partial shadowing ion implant, wherein the second implant area is implanted by the partial shadowing ion implant to a predetermined concentration, and the first implant area is substantially not implanted by the partial shadowing ion implant.

2. The method of forming semiconductor devices according to claim 1, wherein the mask pattern is generated by merging a first mask pattern comprising the first implant area and a second mask pattern comprising the second implant area.

3. The method of forming semiconductor devices according to claim 1, wherein the partial shadowing ion implant is partial shadowing by the resist layer around the first opening, and is not implanted into the first implant area.

4. The method of forming semiconductor devices according to claim 1, wherein the partial shadowing ion implant has a tilt angle ranges from 30° to 45°.

5. The method of forming semiconductor devices according to claim 4, wherein the tilt angle of the partial shadowing ion implant is 45°.

6. The method of forming semiconductor devices according to claim 4, wherein the partial shadowing ion implant is performed in quad mode and comprises four sub implants having identical tilt angle and doping dosage.

7. The method of forming semiconductor devices according to claim 6, wherein the four sub implants have twist angles of 0°, 90°, 180° and 270° accordingly.

8. The method of forming semiconductor devices according to claim 1, wherein the ion implantation process further comprises another ion implant.

9. The method of forming semiconductor devices according to claim 8, wherein the pre-determined concentration of the second implant area is determined by the summary of the partial shadowing ion implant and the another ion implant.

10. The method of forming semiconductor devices according to claim 1, wherein the first device and the second device have the same conductivity type.

11. A method of forming semiconductor devices, comprising:
providing a substrate;
defining a first implant area, a second implant area and a third implant area of a mask pattern;
using the mask pattern to pattern a resist layer on the substrate to form a first opening exposing the first implant area and a second opening exposing the second implant area and the third implant area; and
processing an ion implantation process including a partial shadowing ion implant, wherein the first implant area is implanted by the partial shadowing ion implant to a predetermined concentration, and the second implant area and the third implant area are implanted by the partial shadowing ion implant to a concentration which is half of the predetermined concentration.

12. The method of forming semiconductor devices according to claim 11, wherein the mask pattern is generated by merging a first mask pattern comprising the first implant area and a second mask pattern comprising the second implant area and the third implant area.

13. The method of forming semiconductor devices according to claim 11, wherein the partial shadowing ion implantation is partial shadowing by the resist layer around the second opening.

14. The method of forming semiconductor devices according to claim 11, wherein the partial shadowing ion implant has a tilt angle ranges from 30° to 45°.

15. The method of forming semiconductor devices according to claim 14, wherein the tilt angle of the partial shadowing ion implant is 40°.

16. The method of forming semiconductor devices according to claim 14, wherein the partial shadowing ion implant is performed in quad mode and comprises four sub implants having identical tilt angle and doping dosage.

17. The method of forming semiconductor devices according to claim 16, wherein the first implant area is implanted by two of the four sub implants, and the second implant area and the third implant area are implanted by one of the four sub implants.

18. The method of forming semiconductor devices according to claim 11, wherein the ion implantation process further comprises another ion implant, wherein the first implant area, the second implanted area and the third implant area are all implanted by the another ion implant.

19. The method of forming semiconductor devices according to claim 11, wherein the first device, the second device and the third device have the same conductivity type.

20. The method of forming semiconductor devices according to claim 11, wherein the first device is a peripheral PMOS transistor, and the second device and the third device are the PL1 and PL2 transistors of a 6T SRAM cell.

* * * * *